United States Patent
Fumitake

(10) Patent No.: US 8,546,224 B2
(45) Date of Patent: Oct. 1, 2013

(54) METHOD FOR MANUFACTURING TWIN BIT STRUCTURE CELL WITH ALUMINUM OXIDE LAYER

(75) Inventor: Mieno Fumitake, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 12/965,808

(22) Filed: Dec. 10, 2010

(65) Prior Publication Data
US 2011/0140190 A1    Jun. 16, 2011

(30) Foreign Application Priority Data
Dec. 15, 2009   (CN) .......................... 2009 1 0201181

(51) Int. Cl.
H01L 21/336   (2006.01)
H01L 29/792   (2006.01)

(52) U.S. Cl.
USPC ............... 438/287; 257/324; 257/E21.423; 257/E29.309

(58) Field of Classification Search
USPC ............ 257/324, E29.309, E21.21, E21.423, 257/326, 321, E29.054, E21.218, E21.679; 438/287, 288, 239, 254, 261, 265, 591
See application file for complete search history.

(56) References Cited

U.S. PATENT DOCUMENTS

| | | | |
|---|---|---|---|
| 5,658,822 A | 8/1997 | Wu et al. | |
| 5,661,592 A | 8/1997 | Bornstein et al. | |
| 6,018,178 A | 1/2000 | Sung | |
| 6,040,605 A | 3/2000 | Sano et al. | |
| 6,187,659 B1 | 2/2001 | Ying et al. | |
| 6,268,235 B1 | 7/2001 | Sakakura et al. | |
| 6,538,292 B2 | 3/2003 | Chang et al. | |
| 6,806,517 B2 | 10/2004 | Kim et al. | |
| 6,835,621 B2 * | 12/2004 | Yoo et al. | 438/261 |
| 6,861,307 B2 | 3/2005 | Zheng et al. | |
| 6,884,734 B2 | 4/2005 | Buehrer et al. | |
| 6,955,960 B2 | 10/2005 | Bhattacharyya | |
| 7,012,297 B2 | 3/2006 | Bhattacharyya | |

(Continued)

OTHER PUBLICATIONS

Non-Final Office Action for U.S. Appl. No. 12/969,563, mailed on Apr. 26, 2012, 22 pages.
Non-Final Office Action for U.S. Appl. No. 12/978,346, mailed on Oct. 7, 2011, 13 pages.

(Continued)

*Primary Examiner* — Matthew Landau
*Assistant Examiner* — Latanya N Crawford
(74) *Attorney, Agent, or Firm* — Kilpatrick Townsend & Stockton LLP

(57) ABSTRACT

A method for manufacturing a twin bit cell structure with an aluminum oxide material includes forming a gate dielectric layer overlying a semiconductor substrate and a polysilicon gate structure overlying the gate dielectric layer. An undercut region is formed in each side of the gate dielectric layer underneath the polysilicon gate structure. Thereafter, an oxidation process is performed to form a first silicon oxide layer on a peripheral surface of the polysilicon gate structure and a second silicon oxide layer on an exposed surface of the semiconductor substrate. Then, an aluminum oxide material is deposited over the first and second silicon oxide layers including the undercut region and the gate dielectric layer. The aluminum oxide material is selectively etched to form an insert region in a portion of the undercut region. A sidewall spacer is formed to isolate and protect the exposed aluminum oxide material and the polysilicon gate structure.

20 Claims, 8 Drawing Sheets

(56) References Cited

U.S. PATENT DOCUMENTS

| | | |
|---|---|---|
| 7,132,337 B2 | 11/2006 | Jakschick et al. |
| 7,518,912 B2 | 4/2009 | Hung et al. |
| 7,521,317 B2 * | 4/2009 | Li et al. .................. 438/257 |
| 7,589,368 B2 | 9/2009 | Lee |
| 7,666,739 B2 | 2/2010 | Lee et al. |
| 7,723,789 B2 | 5/2010 | Lin et al. |
| 7,732,281 B1 | 6/2010 | Shen et al. |
| 7,851,285 B2 | 12/2010 | Park |
| 7,915,123 B1 * | 3/2011 | Lee et al. .................. 438/261 |
| 8,114,732 B2 * | 2/2012 | Fumitake .................. 438/239 |
| 2002/0164841 A1 | 11/2002 | Assaderaghi et al. |
| 2004/0021172 A1 | 2/2004 | Zheng et al. |
| 2004/0142528 A1 | 7/2004 | Bhattacharyya |
| 2004/0183106 A1 * | 9/2004 | Kim et al. .................. 257/239 |
| 2006/0001075 A1 * | 1/2006 | Shih .................. 257/315 |
| 2006/0046403 A1 * | 3/2006 | Chu et al. .................. 438/288 |
| 2006/0134871 A1 * | 6/2006 | Jakschik et al. .................. 438/287 |
| 2007/0134914 A1 | 6/2007 | Cheong et al. |
| 2008/0017954 A1 | 1/2008 | Suzuki et al. |
| 2008/0049517 A1 | 2/2008 | Hung et al. |
| 2008/0061359 A1 | 3/2008 | Lee et al. |
| 2008/0153222 A1 | 6/2008 | Lee et al. |
| 2008/0182377 A1 | 7/2008 | Rao et al. |
| 2008/0213963 A1 * | 9/2008 | Shih .................. 438/287 |
| 2008/0293199 A1 | 11/2008 | Lin et al. |
| 2008/0315290 A1 * | 12/2008 | Lee et al. .................. 257/321 |
| 2009/0032864 A1 | 2/2009 | Inoue |
| 2009/0096014 A1 | 4/2009 | Choi et al. |
| 2009/0115318 A1 | 5/2009 | Gregory et al. |

OTHER PUBLICATIONS

Notice of Allowance for U.S. Appl. No. 12/704,502, mailed on Oct. 11, 2011, 7 pages.
Final Office Action for U.S. Appl. No. 12/704,502, mailed on Jun. 10, 2011, 13 pages.
Non-Final Office Action for U.S. Appl. No. 12/704,502, mailed on Nov. 26, 2010, 11 pages.
Final Office Action for U.S. Appl. No. 12/704,502, mailed on Apr. 4, 2011, 12 pages.
Non-Final Office Action for U.S. Appl. No. 12/704,502, mailed on Nov. 26, 2010, 10 pages.
Requirement for Restriction/Election for U.S. Appl. No. 12/978,473, mailed on Oct. 18, 2012, 6 pages.
Requirement for Restriction/Election for U.S. Appl. No. 12/968,264, mailed on May 23, 2012, 7 pages.
Non-Final Office Action for U.S. Appl. No. 12/968,264, mailed on Jul. 10, 2012, 12 pages.
Final Office Action for U.S. Appl. No. 12/978,346, mailed on Jul 20, 2012, 12 pages.
Final Office Action for U.S. Appl. No. 12/969,563, mailed on Aug. 16, 2012, 15 pages.
Final Office Action for U.S. Appl. No. 12/968,264, mailed on Dec. 28, 2012, 14 pages.
Non-Final Office Action for U.S. Appl. No. 12/969,563, mailed on Feb. 4, 2013, 15 pages.
Non-Final Office Action for U.S. Appl. No. 12/978,473, mailed on Jan. 4, 2013, 12 pages.
Non-Final Office Action for U.S. Appl. No. 12/968,264, mailed Jun. 19, 2013, 13 pages.

* cited by examiner

1

METHOD FOR MANUFACTURING TWIN BIT STRUCTURE CELL WITH ALUMINUM OXIDE LAYER

CROSS-REFERENCES TO RELATED APPLICATIONS

This application claims priority to Chinese Application No. 200910056728.5 filed on Aug. 20, 2009 commonly assigned and is hereby incorporated by reference for all purposes. This application is also related to the following co-pending U.S. patent applications, all of which are commonly owned and are hereby incorporated by reference for all purposes, U.S. patent application Ser. No. 12/704,502, filed Feb. 11, 2010, U.S. patent application Ser. No. 12/978,346, filed Dec. 23, 2010, U.S. patent application Ser. No. 12/978,473, filed Dec. 24, 2010, U.S. patent application Ser. No. 12/968, 264, filed Dec. 14, 2010, and U.S. patent application Ser. No. 12/969,563, filed Dec. 15, 2010.

BACKGROUND OF THE INVENTION

Embodiments of the present invention relate to integrated circuits and the processing for the manufacture of semiconductor devices. More particularly, embodiments of the present invention provide a method and a structure for forming a twin bit cell for flash memory devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits, but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in the integrated circuit fabrication has a limit. That is to say, a given process typically only works down to a certain feature size, and then either the process or the device layout needs to be changed. An example of such limitation lies in the manufacture of memory devices. As the feature size continues to shrink, a twin bit cell structure becomes difficult to apply as it is difficult to control the gates independently.

One of the challenges in semiconductor has been the processing of manufacturing twin-bit cell structure for non-volatile memory devices, such as popular flash based memory devices. Among other things, the conventional system and method for manufacturing cells with twin-bit structures are limited when it is required to scaling down the cell size.

From the above, it is seen that an improved process and device structure for manufacturing twin bit cells are desired.

BRIEF SUMMARY OF THE INVENTION

Embodiments of the present invention provide a method and a structure for manufacturing a twin bit cell for a flash memory device. But it should be recognized that the present invention has a much broader range of applicability.

A specific embodiment of the invention provides a method of manufacturing a twin bit cell for a flash memory device. The method includes providing a semiconductor substrate including a surface region and forming a gate dielectric layer overlying the surface region. The method forms a polysilicon gate structure overlying the gate dielectric layer and forms an undercut region underneath the polysilicon gate structure in a portion of the gate dielectric layer. The method exposes the ensemble of the semiconductor substrate including the polysilicon gate structure and the gate dielectric layer having the undercut region to an oxidizing environment to cause a formation of a first silicon oxide layer overlying a peripheral surface of the gate polysilicon structure and a second silicon oxide layer overlying a portion of the surface of the semiconductor substrate. The method also forms an aluminum oxide material overlying the first and second silicon oxide layers including the undercut region. The aluminum oxide material is subjected to a selective etching process to form an insert region in a portion of the undercut region while the insert region remains filled with the aluminum oxide material.

According to another embodiment, the present invention provides a twin bit cell flash memory device. In an embodiment, the memory device includes a semiconductor substrate including a surface region, a gate dielectric layer overlying the surface region, and a polysilicon gate structure overlying the gate dielectric layer. The memory device also contains a first undercut region and a second undercut region underneath the polysilicon gate structure in a first portion and a second portion of the gate dielectric layer. The memory device includes a first silicon oxide layer covering a peripheral surface of the polysilicon gate structure including the respective undersides in the first and second undercut regions. The memory device also includes a second silicon oxide layer covering an exposed surface of the semiconductor substrate. Additionally, the memory device includes an aluminum oxide material in an insert region in a portion of each of the first and second undercut regions. The memory device also includes a sidewall spacer structure overlying each side region of the first silicon oxide layer, exposed side regions of the aluminum oxide material, and a surface region of the second silicon oxide layer. In an embodiment, gate dielectric layer isolates the aluminum material on each insert region of the first and second undercut regions. In another embodiment, the sidewall spacer structure isolates and protects the exposed portion of the aluminum material that functions as a charge trapping region to receive and hold electrons injected into the aluminum material.

Embodiments of the present invention can provide many benefits over conventional techniques. For example, embodiments according to the present invention provide a method to form a reliable twin bit cell structure. According to a specific embodiment, a gate structure is formed on top of a dielectric layer, which is later selectively etched to form undercut regions. The undercut regions are used to accommodative conductive materials such as aluminum oxide material. For example, the conductive material is used to hold charges to stores bits. It is to be appreciated that because of the innovation afforded by the present invention to provide undercut regions, various etching processes according to the present invention are self-aligned. Among other things, the technique according to the present invention for forming twin-bit cell device allows further scaling down of the device in comparison of convention techniques. Furthermore, various processes and techniques can be compatible with conventional systems and equipments, thereby allow cost effective implementation. There are other benefits as well.

Various additional embodiments, features and advantages of the present invention can be more fully appreciated with reference to the detailed description and the accompanying drawings.

DETAILED DESCRIPTION OF THE INVENTION

Embodiments of the present invention generally relate to techniques of manufacturing memory devices. More particularly, embodiments of the present invention provide a method and a structure for manufacturing a twin bit cell for a flash memory device. Merely by way of example, embodiments of the present invention can be applied to manufacturing other non-volatile memory devices, but it would be recognized that the invention has a much broader range of applicability.

Figure 1:
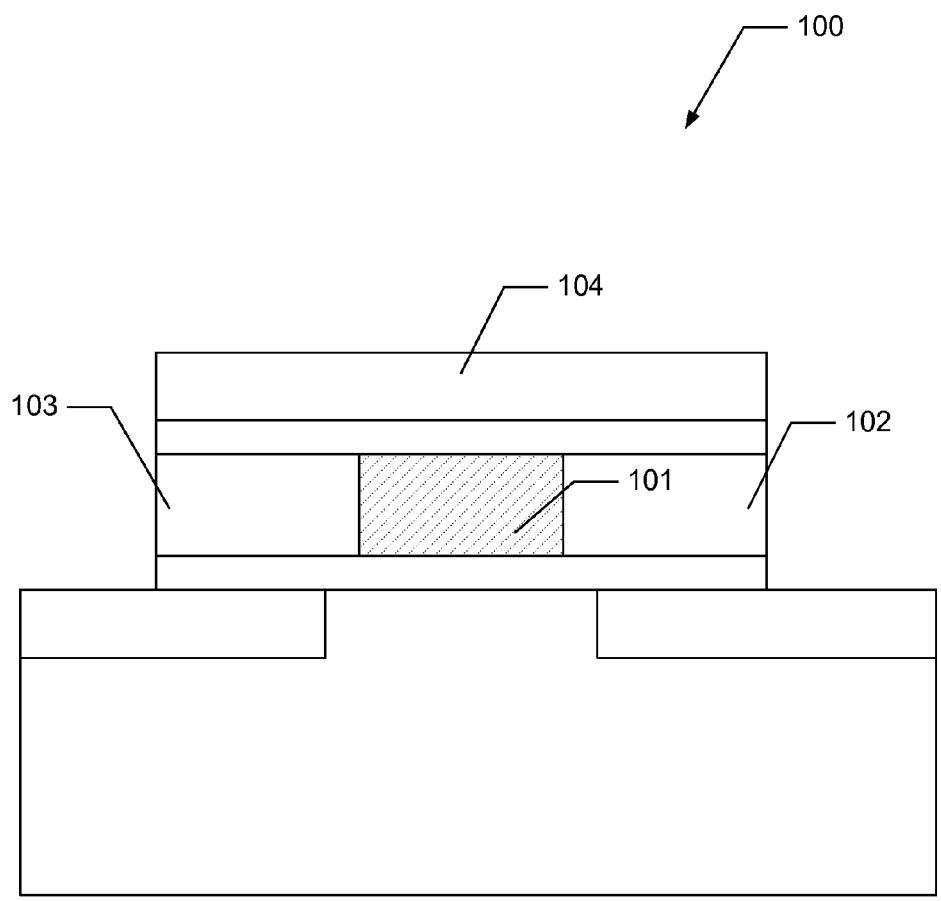
FIG. 1 is a simplified flow diagram illustrating a conventional method of forming a gate structure for a non-volatile memory device.

FIG. 1 is a simplified twin bit cell structure using a conventional method for fabrication. As shown in FIG. 1, the twin-bit structure 100 has two conductive regions 102 and 103 that can be configured to hold charges. The two conductive regions are separated by an isolation region 101. A control gate 104 overlays the conductive regions.

As an example, the twin bit cell structure shown in FIG. 1 is manufactured using the following conventional steps:
1. provide a p-type substrate;
2. form a gate oxide layer overlaying the substrate;
3. perform low-pressure chemical vapor deposition (LPCVD) to form an n-type doped polysilicon layer;
4. perform high temperature oxidation (HTO) to anneal the doped polysilicon layer;
5. provide a layer of undoped polysilicon material;
6. perform HTO on the layer of undoped polysilicon material; and
7. form layer of n-type doped polysilicon material.

Among other things, the conventional manufacturing processes, such as the one outlined above, are difficult to achieve small scale. For example, the formation of an insulating region between the conducting layers (e.g., as provided by the n-type doped regions) is performed by an etching process that can only be scaled down so much. In addition, the use of multiple HTO processes impose a limitation on the total available thermal budget.

Therefore, it is to be appreciated that embodiments of the present invention provide novel manufacturing processes and structures that enable a scaling down of twin-bit cell structure sizes as compared to conventional techniques. An exemplary approach is described in detail below.

Figure 2:
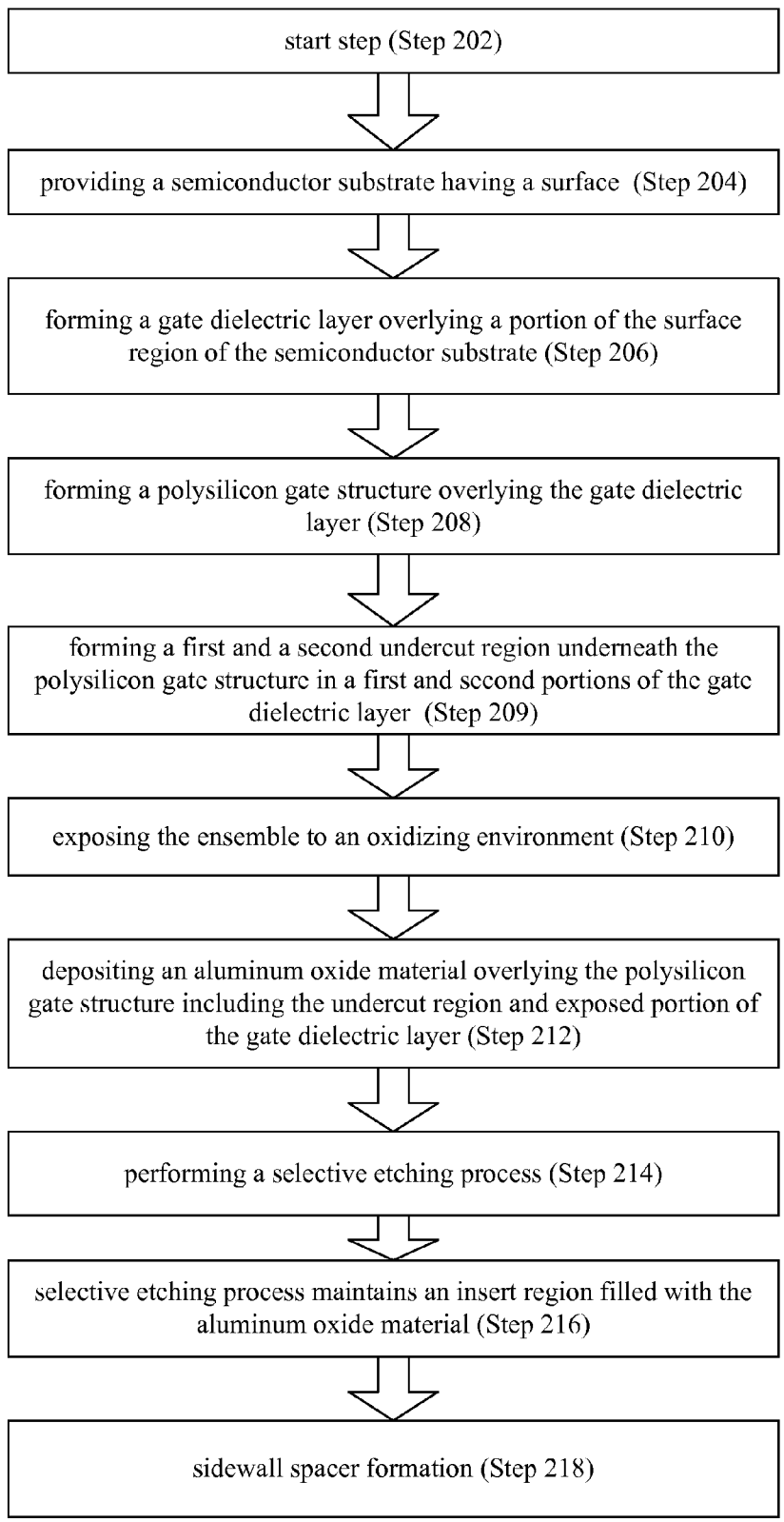
FIG. 2 is a simplified flow diagram illustrating a method of forming a gate structure for a non-volatile memory device according to an embodiment of the present invention.

FIG. 2 is a simplified flow diagram illustrating a method of forming a twin cell structure according to an embodiment of the present invention. This diagram is merely an example and should not unduly limit the claims herein. One skilled in the art would recognized other variations, modifications, and alternatives.

As shown, the method begins with a start step (Step 202). The method includes providing a semiconductor substrate having a surface region (Step 204). In a specific embodiment, the semiconductor substrate comprises a single crystal silicon doped with a P-type impurity. Alternatively, the semiconductor substrate may comprise a silicon on insulator substrate, commonly known as SOI, a silicon germanium wafer, or others.

The method includes forming a gate dielectric layer overlying a portion of the surface region of the semiconductor substrate (Step 206). Depending on the application, the gate dielectric layer can be formed in various ways, for example, using a thermal growth process. In a specific embodiment, the gate oxide layer can be formed using a high temperature oxidation process to obtain a silicon oxide layer having a thickness of 250 angstroms and less.

The method further includes forming a polysilicon gate structure overlying the gate dielectric layer (Step 208). In an embodiment, the polysilicon gate structure can be formed by depositing a doped polysilicon material followed by a patterning and etching process. In a specific embodiment, an LPCVD process is used to form the polysilicon gate layer having a thickness of about 1000 angstroms and less. In an exemplary embodiment, silane may be used as a reactant gas to perform the LPCVD process.

In Step 209, a first undercut region and a second undercut region are formed underneath the polysilicon gate structure in a first portion and a second portion of the gate dielectric layer. In a specific embodiment, the first and second undercut regions are formed by subjecting the ensemble of the device structure to an isotropic dielectric etching process. In an embodiment, a wet HF etching process may be used. In another embodiment, an isotropic dry dielectric etching process may be used.

The method further exposes the ensemble of the semiconductor substrate, the gate dielectric layer including the undercut regions, and the polysilicon gate layer to an oxidizing environment (Step 210). In a specific embodiment, a first silicon oxide layer is formed overlying a peripheral surface of the polysilicon gate structure and a second silicon oxide layer is formed overlying an exposed portion of the surface of the semiconductor substrate that is not covered by the gate dielectric layer.

The method then deposits an aluminum oxide material overlying the first and second silicon oxide layers including the first and second undercut regions of the gate dielectric layer (Step 212). According to an embodiment, the aluminum oxide material is deposited using atomic layering depositing process, the aluminum oxide material having a aluminum-to-oxygen ratio of between 1:1.3 to 1:1.7. In an embodiment, the aluminum oxide material comprises a chemical formula of $Al_2O_3$.

The method then performs a selective etching process (Step 214) to remove a portion of the aluminum oxide material. In a preferred embodiment, the selective etching process maintains an insert region filled with the aluminum oxide material in each of the first and second undercut regions (Step 216). In an embodiment, the thickness (or height) of the undercut regions in the gate oxide layer determines the thickness of the aluminum oxide material.

The method performs other processes to complete the cell structure. For example, these other processes can include sidewall spacer formation (Step 218), among others. The method also includes performing other steps to complete the memory device. Of course, there can be other modifications, variations, and alternatives.

FIGS. 3-11 are simplified cross-sectional diagrams illustrating a method for forming a twin bit cell structure for a memory device according to an embodiment of the present invention. These diagrams are merely examples and should not unduly limit the claims herein. One skilled in the art would recognized other variations, modifications, and alternatives. It is to be appreciated that various steps as illustrated in these figures can be performed in various sequences, repeated, modified, rearranged, and/or overlapped.

Figure 3:
FIG. 3-11 are simplified cross-sectional diagrams illustrating a method of forming a gate structure for a non-volatile memory device according to an embodiment of the present invention.

As shown in FIG. 3, according to an embodiment of the present invention, a method for fabricating a twin-bit cell flash memory device includes providing a semiconductor substrate 302. The semiconductor substrate can be a P-type silicon substrate. Alternatively, the semiconductor substrate can be a silicon on insulator substrate, commonly known as SOI. The semiconductor substrate can also be a silicon germanium wafer or others, depending on the embodiment. As shown, the semiconductor substrate includes a surface region 304.

Figure 4:
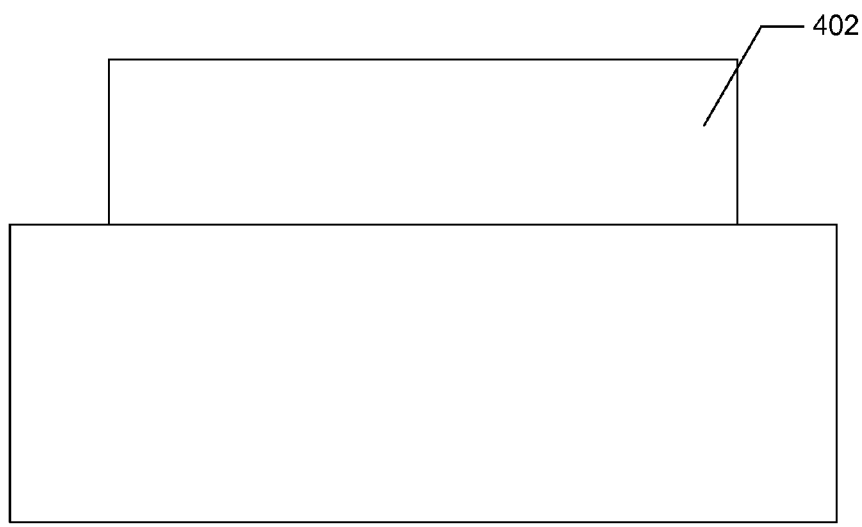

In a specific embodiment, the method includes forming a gate dielectric layer 402 overlying the surface region of the semiconductor substrate as shown in FIG. 4. The gate dielectric layer can be a high density silicon oxide layer formed by a thermal growth process. The gate dielectric layer can also be a composite dielectric stack, for example, silicon oxide on silicon nitride on silicon oxide stack, commonly known as ONO. Other dielectric materials such as silicon nitride, silicon oxynitride, may also be used, depending on the embodiment. Taking a thermally grown oxide as the gate dielectric layer as an example, the gate dielectric can have a thickness ranging from about 20 Angstroms to about 1000 Angstroms. In a specific embodiment, a high temperature oxidation process is used to form the gate dielectric layer 402 comprising mostly silicon oxide, wherein the dielectric layer 402 includes a thickness of about 50 angstroms to about 1000 angstroms. Of course, there can be other variations, modifications, and alternatives.

Figure 5:
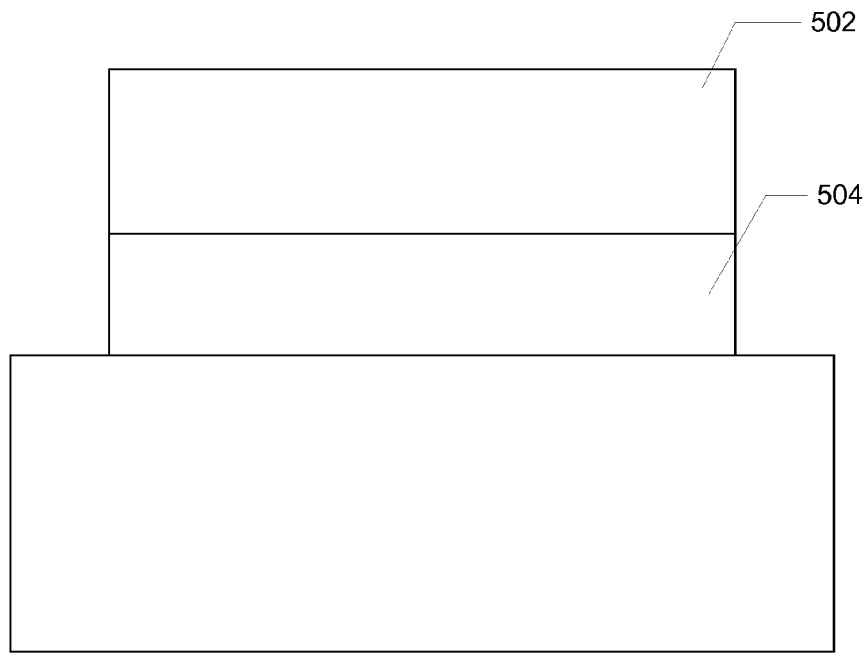

Referring to FIG. 5, the method includes forming a gate structure 502 overlying the gate dielectric layer 504. In a specific embodiment, the gate structure can be a polysilicon gate structure. The polysilicon gate structure can be formed by a deposition of a polysilicon material followed by a patterning and an etching process. In an embodiment, an LPCVD process is used to form the polysilicon gate structure on the surface of the gate dielectric layer. The polysilicon material may be doped with suitable impurities to obtain a desirable property. In a specific embodiment, the polysilicon material is doped with N-type impurities such as arsenic, phosphorus, or antimony, but can be others. In an exemplary embodiment, the doping concentration of the N-type impurities can be about $1.0E18$ to about $1.0E22$ atoms/$cm^3$. Depending on specific embodiments, the gate structure 502 may have a thickness of about 300 angstroms to about 5,000 angstroms.

Figure 6:
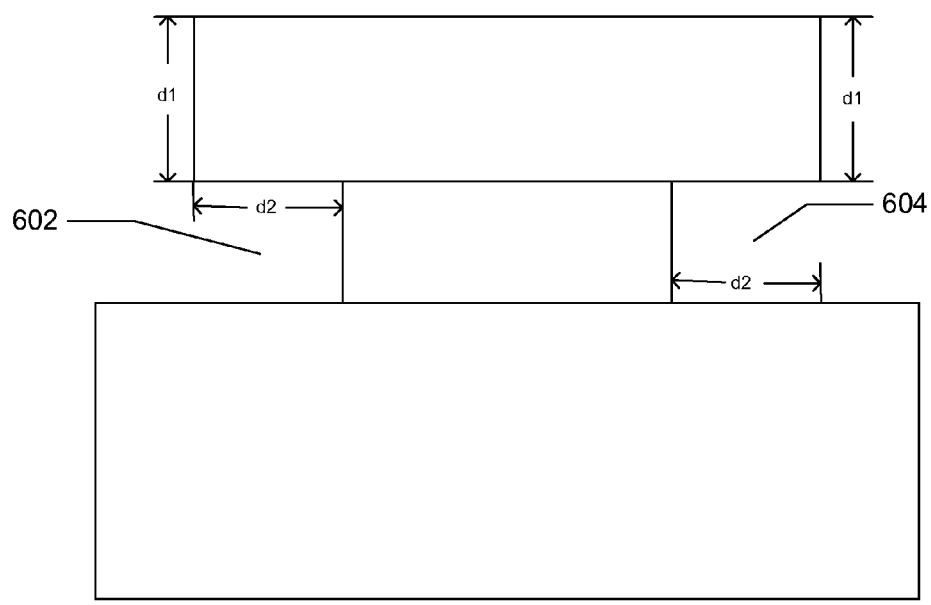

In a specific embodiment, the method forms a first undercut region 602 in a first portion and a second undercut region 604 in a second portion of the gate dielectric layer as shown in FIG. 6. The first and second undercut regions can be formed using a self-limiting etching process in a specific embodiment. For example, the area of the undercut region depends at least on the thickness d1 of the polysilicon layer. In a specific embodiment, a selective etching process is performed to partially remove a portion d2 of the gate dielectric layer, which may include a silicon oxide ($SiO_2$) material. For example, the selectivity of the etching process is determined by the layers that surround the gate dielectric layer that is partially etched away (e.g., the gate structure and the substrate together provide alignment for the etching). The undercut region is a void region as defined by the gate dielectric thickness in a specific embodiment, as shown. It is to be appreciated that using the self-limiting etching process as described above, a photoresist layer is not required so that the device can be further scaled down comparing with conventional processes.

Referring still to FIG. 6, the etching process can be a wet dielectric etch process, e.g., an HF solution for etching silicon oxide. Alternatively, an isotropic dry etch process suitable for etching the gate dielectric layer can be used. In a specific embodiment, the thin gate dielectric limits the transport of etchant chemicals and etch residues, thereby causing the etch process to be substantially self-limiting. In an embodiment, this is a self-aligned etching process, so a lithographic process and a photoresist layer are not needed. As a result, the device dimension is not subject to the limitations of the lithographic patterning process. In an embodiment, the width of the remaining gate dielectric can be smaller than the minimum geometry allowed in the lithographic process. Further, the width of the undercut region can also be made to be smaller than the minimum geometry. In a specific exemplary embodiment, the width of the gate dielectric layer can be equal to the width allowed by the minimum geometry, and the undercut regions and the remaining gate dielectric layer can be smaller than the minimum geometry. As a result, embodiments of the present invention enable a formation of a minimum geometry twin-bit memory cell and provide a method of fabricating high density twin-bit cell flash memory devices without reducing the critical dimensions of the silicon wafer. Thus, embodiments of the present invention provide higher density memory devices without increasing yield loss due to smaller critical dimensions as is the case in prior art approaches.

Figure 7:
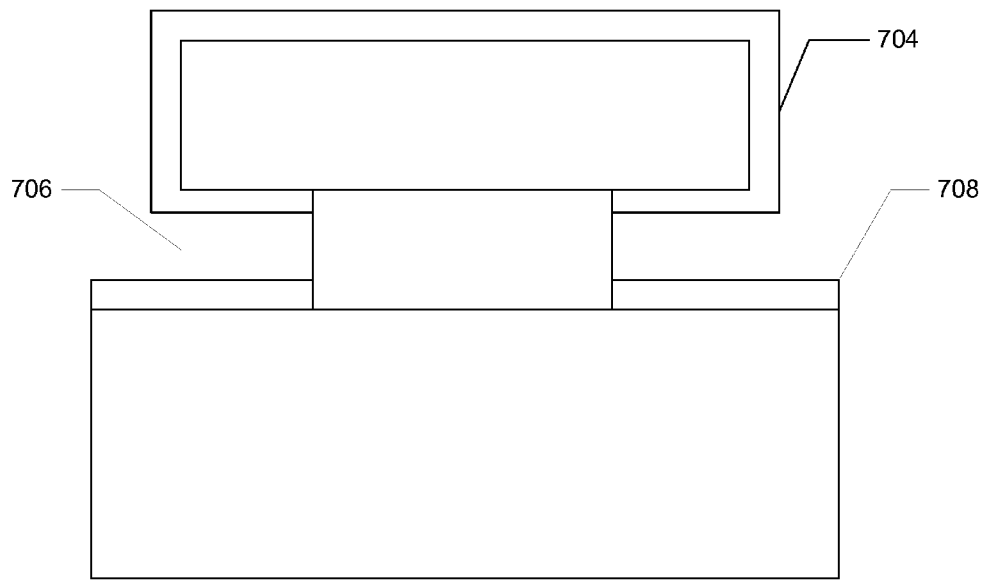

In a specific embodiment, the method exposes the polysilicon gate structure to an oxidizing environment to form an oxide layer 704 as illustrated in a FIG. 7. The oxidizing environment causes a first silicon oxide layer 704 to form on a peripheral surface of the polysilicon gate. For example, the first silicon oxide layer 704 includes oxide formed polysilicon material that is doped with N-type impurities. The oxidizing environment also forms a silicon oxide layer 708 on the surface region of the semiconductor substrate. In an embodiment, the silicon oxide layer 708 includes oxide formed with the doped (P-type) single silicon material. Of course, there can be other variations, modifications, and alternatives.

Figure 8:
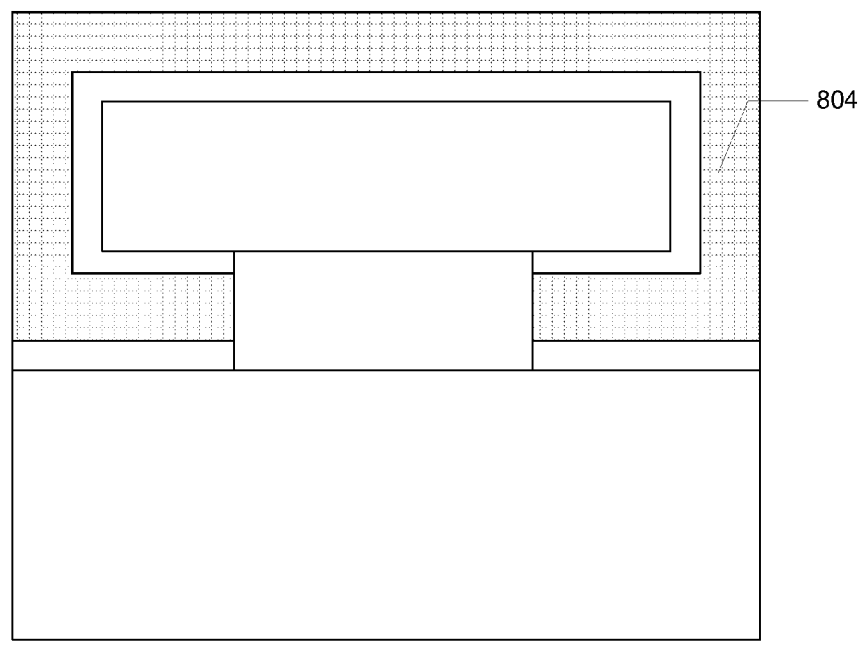

In a specific embodiment, the method includes forming an aluminum oxide material 804 on the first silicon oxide layer over the peripheral region of the polysilicon gate structure and on the second oxide layer. The aluminum oxide material also fills the undercut region as shown in FIG. 8. In a specific embodiment, the aluminum oxide material 804 may be deposited using an atomic layer depositing technique. In an embodiment, aluminum oxide material 804 is characterized by a aluminum-to-oxide ratio of about 1:1.3 to about 1:1.7. Depending on the applications, various types of deposition techniques may be used. As shown, the aluminum oxide material 804 fills the entire undercut region surrounded by the underside of the first silicon oxide layer, the gate dielectric layer and the second silicon oxide layer on the semiconductor substrate. As shown in FIG. 8, the thickness of the aluminum oxide material may be controlled by the thickness of the gate oxide layer according to an embodiment of the present invention. In a specific embodiment, the aluminum oxide material has charge trapping capability to receive and store charges injected into the aluminum oxide material. Of course, there can be other variations, modifications, and alternatives.

Figure 9:
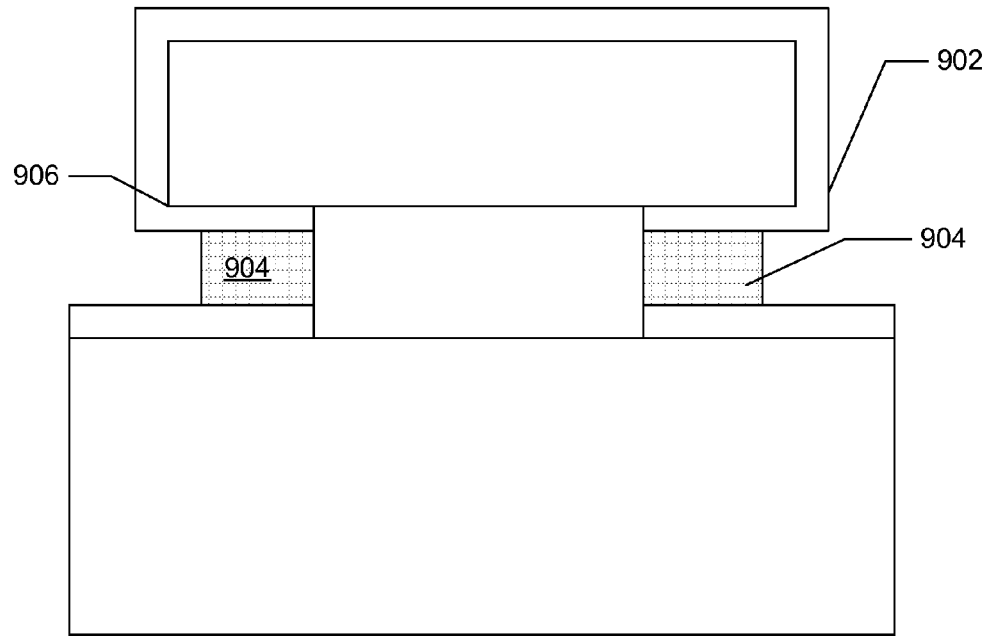

FIG. 9 is a simplified diagram exemplified an embodiment of the present invention. As shown, the method performs a selective etching process to remove a first portion of the aluminum oxide material from the gate structure while maintaining the aluminum oxide material in an insert region 904 within the undercut region. In a specific embodiment, a reactive ion etching (RIE) process is used to remove a portion of the aluminum oxide material. For example, a void region 906 is formed after portions of the aluminum oxide material are removed with the RIE process. In an embodiment, the device may be placed in a vacuum chamber for the etching process. As shown in FIG. 9, the polysilicon gate structure including the first silicon oxide layer 902 can be used to provide the necessary alignment for the selective etching process. The aluminum oxide material in the insert region provides a double side structure with a twin bit function for the memory device in a specific embodiment. For example, the aluminum oxide material on each side can be adapted to hold charges, so that each side can provide a bit of memory. The aluminum oxide material on each side is separated by an insulating layer to prevent one charge from interfering with the other. Of course, there can be other variations, modifications, and alternatives.

Figure 10:
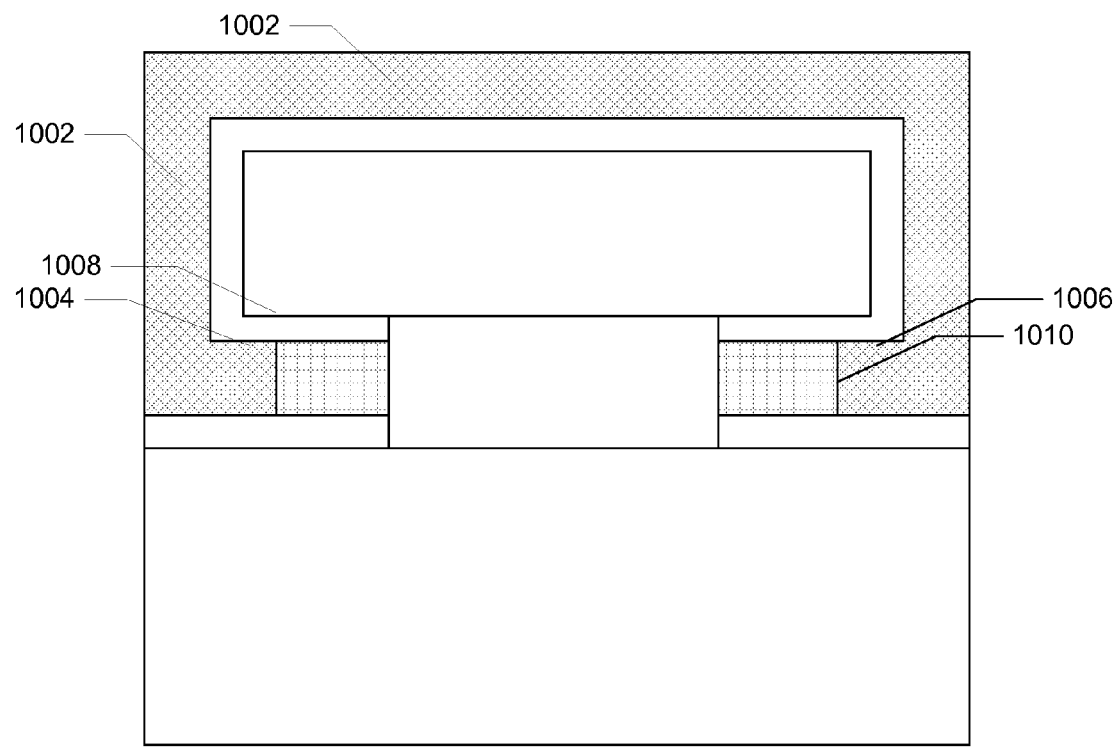

Referring to FIG. 10, the method forms a conformal dielectric layer 1002 on the polysilicon gate structure, the surface regions 1004, 1006 of the silicon oxide layer and the exposed portions 1008, 1010 of the insert regions. The conformal dielectric layer may be a silicon oxide deposited using TEOS as a precursor in a specific embodiment. The conformal dielectric layer may also be a composite stack such as a silicon oxide on silicon nitride on silicon oxide (or commonly known as SONOS) depending on the embodiment.

Figure 11:
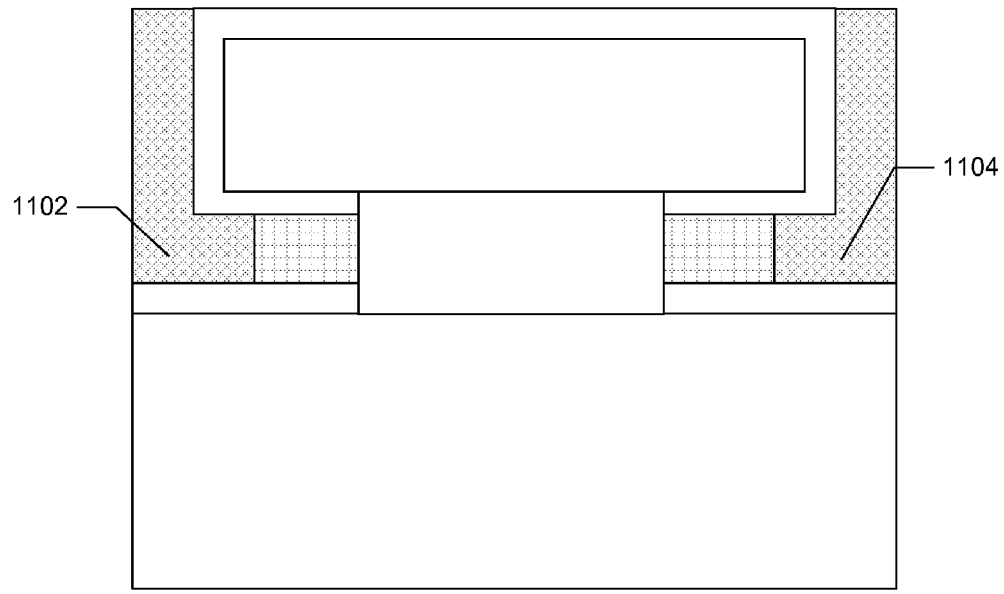

Referring to FIG. 11, the method includes performing a selective etching process to remove a portion of the dielectric layer 1002, thus forming sidewall spacer structures 1102, 1104 exposing the top portion of the polysilicon gate structure. According to an embodiment, the sidewall spacer includes a silicon dioxide material. The sidewall spacer structures 1102, 1104 are used to insulate the sides of the polysilicon gate structure and the exposed portions of the aluminum oxide material in the insert regions. The sidewall spacer structure isolates and protects the exposed portions of the aluminum oxide material and the polysilicon gate structure according to a specific embodiment.

It is to be appreciated that various steps and structures associated with the processed described above can be modified, added, removed, repeated, replaced, and/or overlapped. In a specific embodiment, an implantation process is performed to introduce arsenic (As) into an active region of the device. In an embodiment, As can be used to function as N-type dopant.

Figure 12:
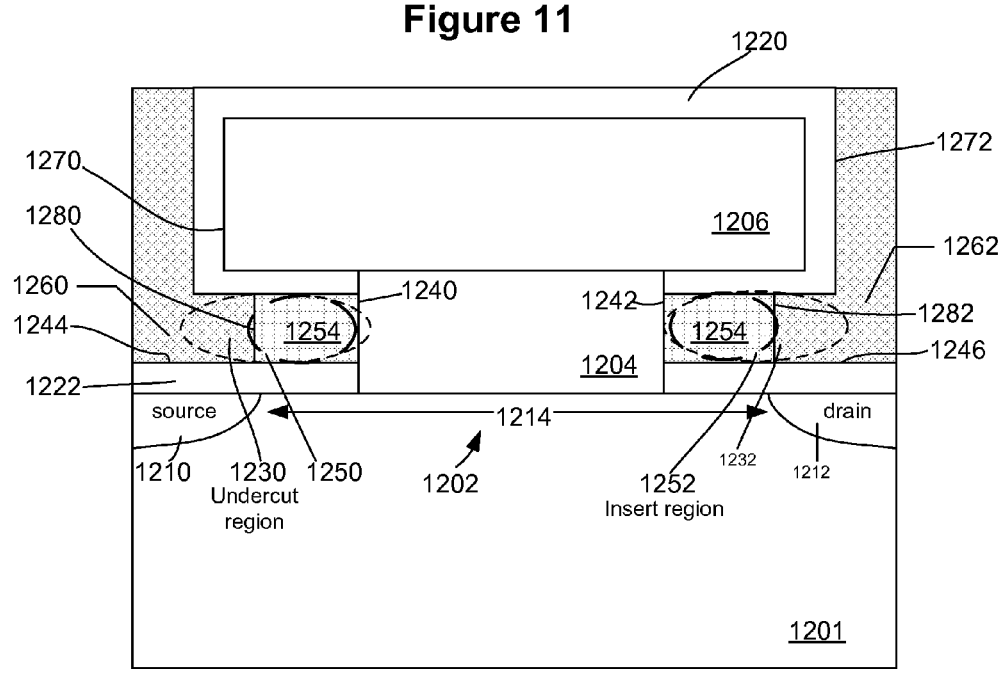
FIG. 12 is a simplified cross-sectional view of a twin-bit cell flash memory device according to an embodiment of the present invention.

FIG. 12 is a cross-sectional diagram of a twin-bit cell flash memory device 1200 according to an embodiment of the present invention. The twin-bit cell flash memory device includes a semiconductor substrate 1201 having an active region 1202, a gate dielectric layer 1204 overlying the active region, a polysilicon gate structure 1206 overlying the gate dielectric layer. The semiconductor substrate also contains a source 1210, a drain 1212 and a channel 1214 between the source and the drain. The twin-bit cell flash memory device also includes a first silicon oxide layer 1220 overlying a peripheral surface of the polysilicon gate structure and a second silicon oxide layer 1222 overlying a surface of the semiconductor substrate. The twin-bit cell flash memory device further includes undercut regions 1230, 1232; each of the undercut regions is surrounded by the first silicon oxide layer covering an underside of the first polysilicon gate structure, a side portion (1240, 1242) of the gate dielectric layer and a surface region (1244, 1246) of the second silicon oxide layer. Each of the undercut regions (1230, 1232) contains an insert region (1250, 1252) filled with an aluminum oxide material 1254. Additionally, the twin-bit cell flash memory device includes sidewall spacer structures 1260, 1262; each of the sidewall spacer structures overlies an exposed vertical side region (1270, 1272) of the first silicon oxide layer, an exposed vertical side (1280, 1282) of the aluminum oxide material, and a portion of the surface regions (1244, 1246) of the second silicon oxide layer. In an embodiment, each insert region containing the aluminum oxide material functions as a charge trapping region to receive and hold electrons injected into the aluminum oxide material to form a twin bit cell structure; and the sidewall spacer structures are used to insulate the sides of the polysilicon gate structure and the exposed portions of the aluminum oxide material in the insert regions. According to an embodiment, the aluminum oxide material is deposited using atomic layering depositing process, the aluminum oxide material having an aluminum-to-oxygen ratio of between 1:1.3 to 1:1.7. In an embodiment, the aluminum oxide material comprises a chemical formula of $Al_2O_3$.

In an embodiment of the non-volatile memory device, the first silicon oxide layer includes oxidized polysilicon material. In another embodiment, the first silicon oxide layer is formed by oxidizing the polysilicon gate structure. In another embodiment, the non-volatile memory device also includes a second silicon oxide layer overlying a surface region of the semiconductor substrate facing the undercut region; In another embodiment, the non-volatile memory device further includes a second undercut region at least partially filled with the aluminum oxide material. In another embodiment, the polysilicon gate structure is characterized by a width defined by the minimum geometry of a patterning process.

Figure 13:
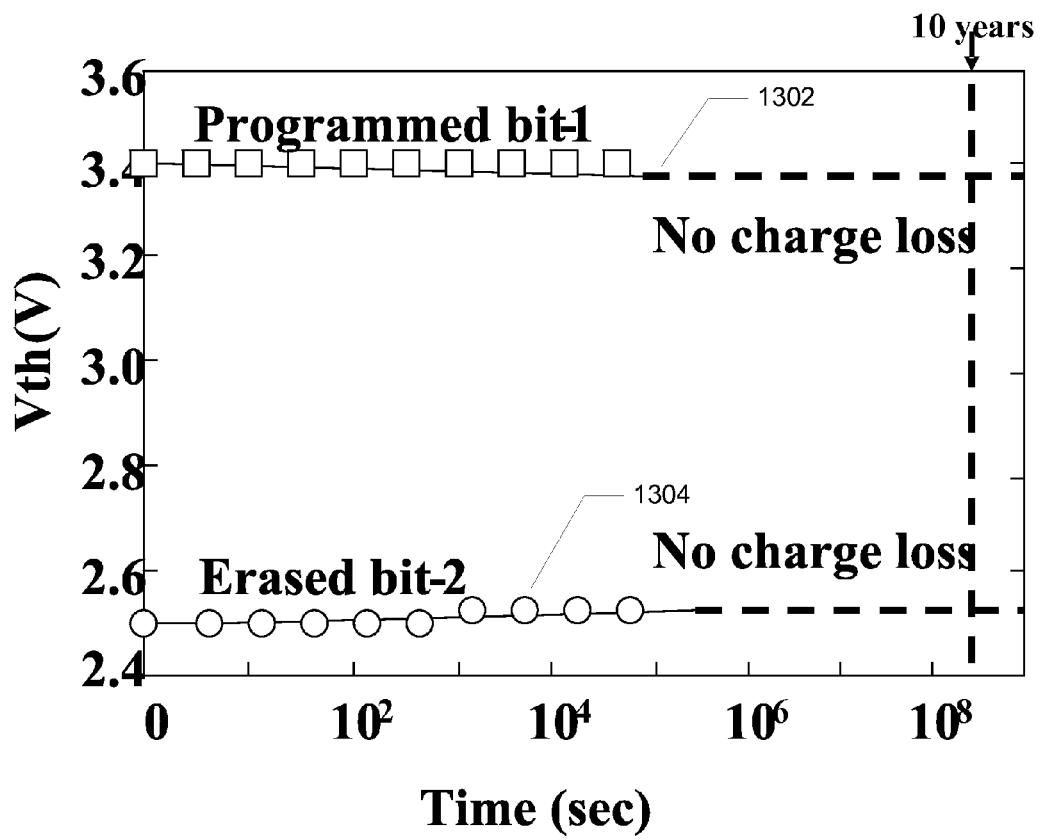
FIG. 13 is a simplified plot illustrating the performance of a twin-bit cell flash memory device according to an embodiment of the present invention.

FIG. 13 is a simplified plot illustrating a retention characteristics of the twin bit memory device using aluminum oxide material according to an embodiment of the present invention. This plot is merely an example and should not unduly limit the claims herein. One skilled in the art would recognize other variations, modifications, and alternatives. As shown, a plot of threshold voltage (Vth) as a function of time is provided. The threshold voltage of a programmed bit 1302 is maintained at about 3.4 volt with no charge loss over a period of $10^8$ seconds. The threshold voltage of an erased bit 1304 is also maintained at a value of about 2.5 volts with no charge loss over the time period. The respective threshold voltages are measured at $Vg=Vd=Vs=Vb=0$. Of course there can be other modifications, variations, and alternatives.

In contrast to prior art approaches, embodiments of the present invention provide a method to increase the density of a twin bit cell structure using a self-limiting etching and without resorting to a lithography process and the use of a photoresist layer. Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for forming a twin bit cell structure for a flash memory device, the method comprising:
   providing a semiconductor substrate including a surface region;
   forming a gate dielectric layer overlying the surface region;
   forming a polysilicon gate structure overlying the gate dielectric layer;
   forming first and second undercut regions underneath the polysilicon gate structure in a portion of the gate dielectric layer;
   exposing the semiconductor substrate, the gate dielectric layer, the undercut regions, and the polysilicon gate structure to an oxidizing environment to cause a formation of a first silicon oxide layer overlying a top surface, side surfaces, and bottom surfaces facing the undercut regions of the polysilicon gate structure and a formation of a second silicon oxide layer overlying a portion of the surface region of the semiconductor substrate;
   depositing an aluminum oxide material over the first and second silicon oxide layers and filling the undercut regions;
   selectively etching a portion of the aluminum oxide material while maintaining the aluminum oxide material in an insert region in a portion of each of the undercut regions; and
   forming a sidewall structure, wherein the sidewall structure is formed so as to contact side and bottom surfaces of the first silicon oxide layer, to contact exposed surfaces of the aluminum oxide material in the undercut regions, and to contact an exposed surface portion of the second oxide layer.

2. The method of claim 1 wherein the polysilicon gate structure is doped with an N-type dopant having a doping concentration of about 1.0E18 to about 10E22 atoms/cm$^3$.

3. The method of claim 1 wherein the sidewall spacer structure is formed by depositing a conformal dielectric layer overlying the polysilicon gate structure followed by a selective etching process.

4. The method of claim 1 wherein the semiconductor substrate is a P-type silicon wafer.

5. The method of claim 1 wherein the undercut regions are formed using a self-limiting etching process.

6. The method of claim 1 wherein the undercut regions are void regions.

7. The method of claim 1 wherein the aluminum oxide material is characterized by a dielectric k value of about eight or greater.

8. The method of claim 1 wherein the aluminum oxide material is formed using atomic layer deposition.

9. The method of claim 8 wherein the aluminum oxide material has an aluminum to oxygen ratio of about 1:1.3 to about 1:1.7.

10. The method of claim 1 wherein the insert regions provide a double-sided bit structure.

11. The method of claim 1 wherein the aluminum oxide material is characterized by a first thickness, the first thickness being controlled by a thickness of the gate dielectric layer.

12. The method of claim 1 further comprises forming active regions in a vicinity of the surface region of the semiconductor substrate.

13. The method of claim 12 wherein the active regions are formed by an implantation process using an N type arsenic as an impurity species and the polysilicon gate structure, including the sidewall spacer as a mask.

14. The method of claim 1 wherein the selective etching process comprises a reactive ion etching process.

15. A twin bit cell flash memory device, the memory device comprising:
    a semiconductor substrate having a surface region;
    a gate dielectric layer overlying the surface region;
    a polysilicon gate structure overlying the gate dielectric layer;
    a first undercut region and a second undercut region, the first and second undercut regions being underneath the polysilicon gate structure in a portion of each side of the gate dielectric layer;
    a first silicon oxide layer covering a top surface, side surfaces, and bottom surfaces facing the undercut regions of the polysilicon gate structure and filling areas in the first and second undercut regions;
    a second silicon oxide layer covering an exposed portion of the surface region of the semiconductor substrate;
    an aluminum oxide material in an insert region in a portion of each of the first and second undercut regions; and
    a sidewall spacer structure contacting a side region of the first silicon oxide layer, an exposed side region of the aluminum oxide material in one of the undercut regions, and a surface region of the second silicon oxide layer.

16. The memory device of claim 15 wherein the first silicon oxide layer comprises an oxidized polysilicon material.

17. The memory device of claim 15 wherein the aluminum oxide material is deposited using an atomic layering depositing process.

18. The memory device of claim 15 wherein the aluminum oxide material comprises an aluminum-to-oxygen ration of about 1:1.3 to about 1:1.7.

19. The memory device of claim 15 wherein the polysilicon gate structure is characterized by a width defined by the minimum geometry of a patterning process.

20. The memory device of claim 15 wherein the aluminum oxide material forms a twin bit cell structure.

* * * * *